(12) United States Patent
Kweon

(10) Patent No.: US 6,656,821 B2
(45) Date of Patent: Dec. 2, 2003

(54) FABRICATING FERROELECTRIC MEMORY DEVICE WITH PHOTORESIST AND CAPPING LAYER

(75) Inventor: Soon-Yong Kweon, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/136,439

(22) Filed: May 2, 2002

(65) Prior Publication Data

US 2002/0173139 A1 Nov. 21, 2002

(30) Foreign Application Priority Data

May 3, 2001 (KR) .................................. 2001-024068

(51) Int. Cl.[7] .............................................. H01L 21/46
(52) U.S. Cl. ...................................................... 438/460
(58) Field of Search ................................. 438/627, 401, 438/460, 462

(56) References Cited

U.S. PATENT DOCUMENTS

| | | | |
|---|---|---|---|
| 5,514,622 A | 5/1996 | Bornstein et al. | 437/189 |
| 5,686,761 A | 11/1997 | Huang et al. | 257/753 |
| 5,780,339 A | 7/1998 | Liu et al. | 438/253 |
| 5,801,095 A | 9/1998 | Huang et al. | 438/627 |
| 5,854,127 A | 12/1998 | Pan | 438/629 |
| 5,858,865 A | 1/1999 | Juengling et al. | 438/585 |
| 6,060,783 A | 5/2000 | Juengling et al. | 257/752 |
| 6,100,592 A | 8/2000 | Pan | 257/774 |
| 6,153,517 A | 11/2000 | Chuang et al. | 438/657 |
| 6,153,941 A * | 11/2000 | Maejima | 257/797 |
| 6,171,898 B1 * | 1/2001 | Crenshow et al. | 438/240 |
| 6,232,228 B1 * | 5/2001 | Kwag et al. | 438/669 |
| 6,531,709 B1 * | 3/2003 | Kim et al. | 257/48 |

FOREIGN PATENT DOCUMENTS

| | | |
|---|---|---|
| KR | 1020000027370 | 5/2000 |
| KR | 1020010026933 | 4/2001 |

* cited by examiner

Primary Examiner—Hoai Ho
Assistant Examiner—Quoc Hoang
(74) Attorney, Agent, or Firm—Pillsbury Winthrop LLP

(57) ABSTRACT

Methods for fabricating a ferroelectric memory device are disclosed, in which the cracking of the ferroelectric thin film can be inhibited during a heat treatment in a scribe lane region (for forming an aligning key and an overlay vernier). A first interlayer dielectric film is formed upon a semiconductor substrate on which the transistor has been formed. The first interlayer dielectric film is selectively etched to form a first contact hole and to expose a source/drain. A first conductive film is formed on an entire surface that includes the first contact hole. The first conductive film is selectively etched to form a first conductive pad, the first conductive pad being connected through the first contact hole to the source/drain. A second interlayer dielectric film is formed on an entire surface that includes the first conductive film. The second interlayer dielectric film is selectively etched to form a second contact hole and to expose the first conductive pad so as to form an aligning key region in the scribe lane region. A second conductive film is formed on an entire surface that includes the second contact hole. The second conductive film is selectively etched to form a plug, the plug being connected through the second contact hole to the first conductive pad.

19 Claims, 3 Drawing Sheets

FABRICATING FERROELECTRIC MEMORY DEVICE WITH PHOTORESIST AND CAPPING LAYER

BACKGROUND

The inventions relate in general to fabricating a ferroelectric memory device. More specifically, the inventions relate to fabricating a ferroelectric memory device, in which a ferroelectric thin film is deposited by using a spin-on process.

There have been efforts made to develop a large capacity semiconductor memory device in which a ferroelectric thin film is used in a ferroelectric capacitor so that the refresh limitation of a dynamic random access memory (DRAM) can be overcome. Such a ferroelectric random access memory ("FeRAM") that utilizes the ferroelectric thin film is a kind of nonvolatile memory device. This FeRAM retains the stored information even when power is removed from the device. Its operating speed is comparable to that of DRAM. Accordingly, attention is increasing turning to FeRAM as a likely candidate for a next generation memory device.

The charge storing material for this FeRAM device is a ferroelectric thin film such as, for examples, $SrBi_2Ta_2O_9$ ("SBT") and $Pb(Zr_xTi_{1-x})O_3$ ("PZT"). The ferroelectric thin film has two stable remnant polarizations (Pr). Thus it is formed into a thin film for use in nonvolatile memory. A nonvolatile memory device which uses ferroelectric thin film makes use of a hysteresis characteristic to store '1s' and '0s' using the remnant polarization that is present when an electric field is removed after inputting the signals by adjusting the polarization direction in the direction of the imposed electric field.

In the case where a ferroelectric thin film such as $SrBi_2(Ta_{2-x}Nb_x)_2O_9$ ("SBTN") or $(Bi_{4-x}La_x)Ti_3O_{12}$ ("BLT") having a layered perovskite structure is used to form a ferroelectric capacitor, there are formed upper and lower electrodes which are generally made of Pt, Ir, Ru, $IrO_x$, $RuO_x$, Pt-alloy or the like.

Ferroelectric thin films can be deposited several ways including: (1) spin-on method, (2) physical vapor deposition method (PVD), and (3) chemical vapor deposition method (CVD). These methods are being studied studied, but have not proven to be practical.

In general, the spin-on method has not provided sufficient conformability to the topology of the substrate, and therefore, a flattening process such as the chemical-mechanical polishing (CMP) must be carried out during the fabrication of the FeRAM.

FIG. 1 (Prior Art) illustrates the method for fabricating the FeRAM by the conventional technique.

As shown in FIG. 1 (Prior Art), a field oxide film (FOX) 12 is formed on a semiconductor substrate 11, and then, a first polysilicon layer P1 is deposited on the semiconductor substrate. Then the first polysilicon layer P1 is patterned to form a plurality of word lines 13.

Then an n-type dopant is ion-implanted into the semiconductor substrate 11 by using the word lines 13 as a mask, thereby forming a plurality of n+ sources/drains 14. Then a first interlayer dielectric film 15 is formed on the entire surface of the semiconductor substrate 11 that includes the word lines 13.

Then the first interlayer dielectric film 15 is selectively patterned to form a bit line contact hole by exposing a part of the n+ sources/drains 14. Then a second polysilicon layer P2 is deposited on the entire surface including the bit line contact hole. Then a patterning process is carried out. Thus there are formed a plurality of bit lines 16 which are electrically connected through the contact holes to the sources/drains 14.

Then a second interlayer dielectric film 17 is formed on the first interlayer dielectric film 15 including the bit lines 16. Then the second interlayer dielectric film 17 is selectively patterned to form a plug contact hole. In the region of the plug contact hole, the sources/drains 14 except the portions connected to the bit lines 16 are exposed.

Then, a third polysilicon layer P3 is deposited on the second interlayer dielectric film 17, and then, a recessing etch-back is carried out to form a polysilicon plug 18 which is buried down to a certain depth of the contact hole.

Then titanium (Ti) is deposited on the entire surface, and a heat treatment is carried out, so that reactions between Ti and Si of the polysilicon plug can be induced. Thus a Ti silicide layer 19 is formed on the polysilicon plug 18. The Ti silicide layer 19 forms an ohmic contact between the polysilicon plug 17 and a lower electrode that will be formed later.

Then a TiN layer 20 is formed on the Ti silicide layer 19. Then, the TiN layer 20 is subjected to a chemical-mechanical polishing (CMP). Then a barrier metal layer is formed to completely fill the plug contact hole and to form a stacked structure of the Ti-silicide/TiN layers 19 and 20.

Then a lower electrode 21 and a ferroelectric thin film 22 are sequentially deposited on the barrier metal layer and on the second interlayer dielectric film 17.

As described above, the high-density memory device having the COB (capacitor on bit line) structure as in the conventional technique has the following features. A capacitor is formed on the polysilicon plug 18, and during the contact etching for forming the polysilicon plug 18 in the cell region I, an aligning key region is simultaneously formed in a scribe lane region II.

Particularly, in the case where the chemical-mechanical polishing is carried out, if the polysilicon plug 18 is to be formed by a single step, then the contact hole has to have a depth of at least 10000 Å. Further, when etching the plugging contact hole, the aligning key and an overlay vernier are simultaneously formed in the scribe lane region ||. That is, there is formed a contact hole which has a depth of 10000 Å and a width of 100 $\mu$M×100 $\mu$m Accordingly, the scribe lane region II is not filled during the formation of the polysilicon plug 18. In this state, the lower electrode 21 and the ferroelectric thin film 22 for the capacitor are deposited.

The lower electrode 21 is deposited generally by applying the physical vapor deposition method (PVD), and therefore, there is no problem. However, the ferroelectric thin film 22 is deposited using the spin-on method, and therefore, the thickness of the ferroelectric thin film 22 is significantly increased in the scribe lane region II.

This thick ferroelectric thin film 22 causes cracks 23 to a serious degree during a forth-coming crystallizing heat treatment, and therefore, the alignment and the overlay cannot be checked, with the result that the manufacture of the device becomes difficult.

SUMMARY

The inventions claimed and/or described in this document overcome the above-described limitations associated with conventional techniques.

According to one aspect of the inventions, there is provided a method for fabricating a ferroelectric memory device, in which the cracking of the ferroelectric thin film is inhibited during a heat treatment in a scribe lane region (for forming an aligning key and an overlay vernier).

One of the inventive methods for fabricating a ferroelectric memory device includes: forming a transistor on a cell region of a semiconductor substrate, the semiconductor substrate including the cell region and a scribe lane region, and the transistor including a source/drain; forming a first interlayer dielectric film upon the transistor; selectively etching the first interlayer dielectric film to form a first contact hole and to expose the source/drain; forming a first conductive film on an entire surface (including the first contact hole); selectively etching the first conductive film to form a first conductive pad, the first conductive pad being connected through the first contact hole to the source/drain; forming a second interlayer dielectric film on an entire surface (including the first conductive film); selectively etching the second interlayer dielectric film to form a second contact hole and to expose the first conductive pad so as to form an aligning key region in the scribe lane region; forming a second conductive film on an entire surface (including the second contact hole); selectively etching the second conductive film to form a plug, the plug being connected through the second contact hole to the first conductive pad; and sequentially forming a lower electrode, a ferroelectric thin film and an upper electrode on the second interlayer dielectric film (including the plug).

According to another aspect of the inventions, there is provided a method for fabricating a ferroelectric memory device including: forming a transistor on a cell region of a semiconductor substrate, the semiconductor substrate including the cell region and a scribe lane region, and the transistor including a source/drain; forming a first interlayer dielectric film on an entire surface (including the transistor); selectively etching the first interlayer dielectric film to form a first contact hole and to expose a dopant junction layer; simultaneously forming a bit line and a landing pad so as to be connected through the first contact hole to the dopant junction layer; forming a second interlayer dielectric film on an entire surface (including the bit line and the landing pad); selectively etching the second interlayer dielectric film to form a second contact hole and to expose the landing pad so as to form an aligning key region in the scribe lane region; burying a stacked film of a plug and a barrier film into the second contact hole; and sequentially forming a lower electrode, a ferroelectric thin film and an upper electrode on an entire surface (including the barrier film).

BRIEF DESCRIPTION OF THE DRAWINGS

The inventions will be further described in terms of specific exemplary embodiments described with reference to the attached drawings in which.

DETAILED DESCRIPTION

An exemplary embodiment of the inventions will be described referring to the attached drawings, in such a manner that those ordinarily skilled in the art can easily carry out the present invention.

FIGS. 2a to 2d are sectional views showing a method for fabricating the ferroelectric memory device according to the inventions.

Figure 1:
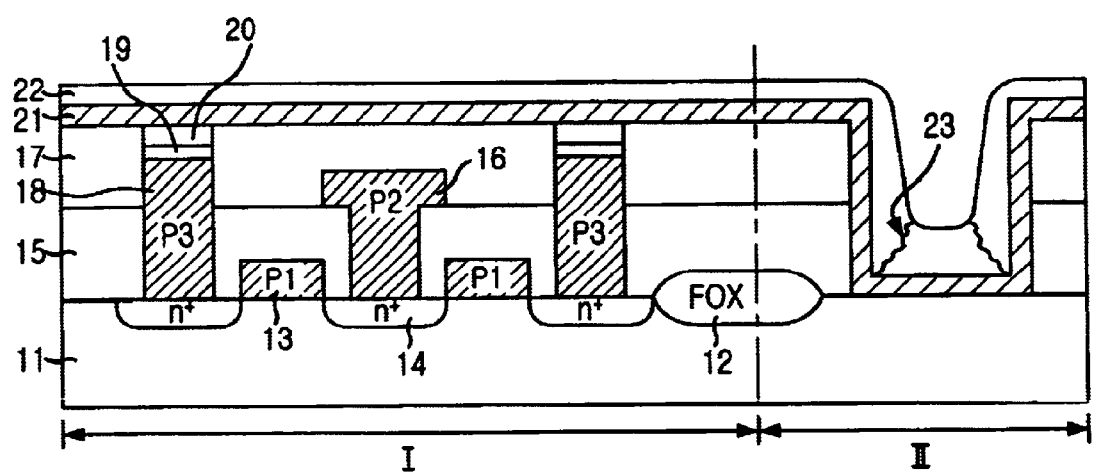
FIG. 1 (Prior Art) is a sectional view of the ferroelectric memory device which is fabricated according to a conventional technique.
Figure 2A:
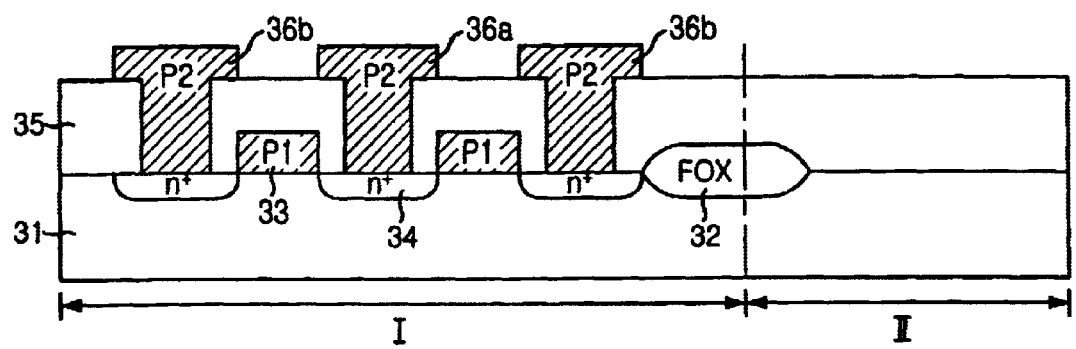
FIGS. 2a to 2d are sectional views showing a method for fabricating the ferroelectric memory device according to the inventions.

As shown in FIG. 2a, a field oxide layer (FOX) 32 is formed on a semiconductor substrate 31 to separate a cell region I from a scribe lane region ‖. Then a first polysilicon layer P1 is deposited on the semiconductor substrate 31, and a patterning process is carried out to form a plurality of word lines 33.

Then a high concentration n-type dopant is ion-implanted by using the word lines 33 as a mask so as to form a plurality of sources/drains 34 on the semiconductor substrate 31. Then a first interlayer dielectric film 35 is formed on the entire surface of the semiconductor substrate 31.

The first interlayer dielectric film 35 is selectively patterned to form contact holes so as to expose the plurality of the n+ sources/drains 34. Then a second polysilicon layer P2 is formed on the first interlayer dielectric film 35 that includes the contact holes.

Then photoresist is spread on the second polysilicon layer P2, and then, a patterning is carried out by exposure and development to form a patterned photoresist layer. Then the second polysilicon layer P2 is etched by using the patterned photoresist layer as a mask to form bit lines 36a and landing pads 36b, the bit lines 36a being electrically connected to the sources/drains 34, and the landing pads 36b being connected to a lower electrode to be formed later.

Thus when forming the bit line contact holes, there are simultaneously formed the contact holes for connecting the bit lines 36a, and the plug lower structure 36b for being connected to the capacitor (which is to be formed later).

Meanwhile, in the case where the bit lines 36a and the landing pads 36b are formed with the second polysilicon (P2), a phosphorus (P)-doped or arsenic (As)-doped polysilicon is used. Or tungsten (W) or tungsten silicide may be used as the material for the bit lines 36a and the landing pads 36b.

Figure 2B:
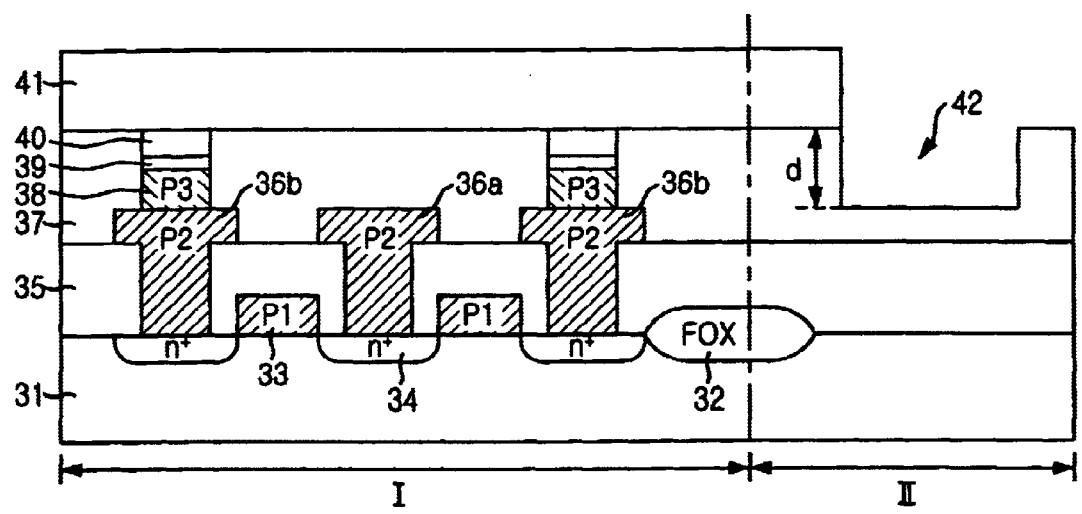
Figure 2C:
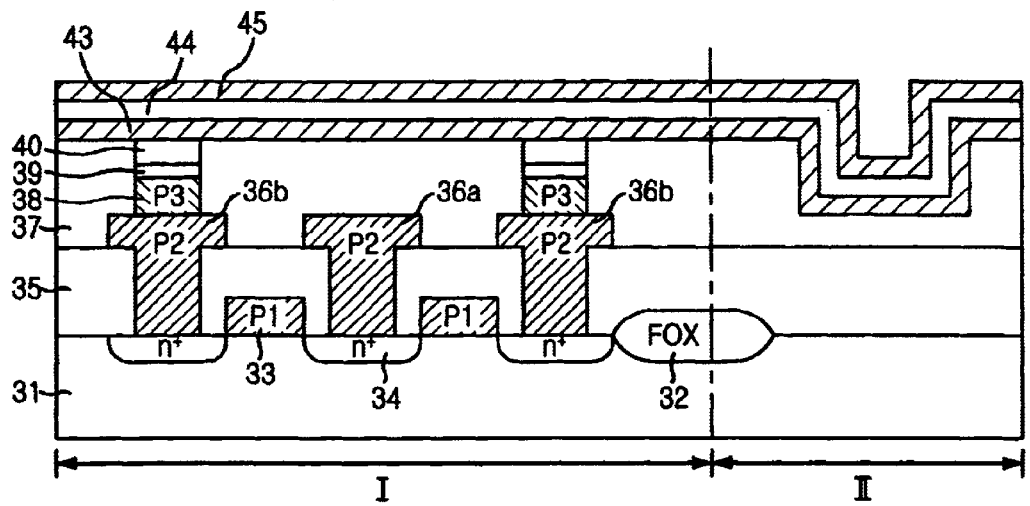

Then as shown in FIG. 2b, a second interlayer dielectric film 37 is formed on the entire surface including the bit lines 36a and the landing pads 36b. Then the second interlayer dielectric film 37 is selectively patterned to form plug contact holes so as to expose relevant parts of the landing pads 36b.

Then a third polysilicon layer P3 is deposited on the second interlayer dielectric film 37 that includes the plug contact holes, and then, a recessing etch-back is carried out. Thus there is formed a polysilicon plug 38 which is buried into the plugging contact hole down to a certain depth.

During the etching of the plug contact hole, there is simultaneously formed a part 42 in which an overlay vernier and aligning key of the scribe lane II are to be formed. The plug contact hole and the part 42 are etched to a same depth d of 1000 Å~5000 Å.

Meanwhile, in the case where the third polysilicon P3 is used for forming the polysilicon plug 38, there is used a phosphorus-doped or arsenic-doped polysilicon. Further, besides the polysilicon plug 38, there can be used another plug material selected from the group consisting of: W-silicide, TiN, TiAlN, TaSiN, TiSiN, TaN, TaAlN, TiSi and TaSi.

The plug material is deposited by applying a process selected from among a chemical vapor deposition method (CVD), a physical vapor deposition method (PVD) and an atomic layer deposition method (ALD).

In the case where the third polysilicon P3 is used as the plug material, a recessing is carried out down to a depth of 500 Å-5000 Å. Meanwhile, in the case where a material other than the polysilicon is used, a chemical-mechanical polishing or an etch-back is carried out, but the recessing etch-back process is not carried out.

Then Ti is deposited on the entire surface, and a heat treatment is carried out in such a manner that reactions can be induced between Ti and Si of the polysilicon plug 38, thereby forming a titanium silicide layer 39 on the polysilicon plug 38. Under this condition, the titanium silicide layer 39 will form an ohmic contact between the polysilicon plug 38 and a lower electrode that will be formed later.

Then a titanium nitride layer (TiN) 40 is formed on the titanium silicide layer 39, and then, a chemical-mechanical polishing (CMP) is carried out on the titanium nitride layer (TiN) 40 in such a manner that the plug contact hole should be completely filled. Thus a barrier film of a stacked structure of the titanium silicide layer/the titanium nitride layer 39/40 is formed on the polysilicon plug 38.

Then photoresist is spread on the second interlayer dielectric film 37 to form a photoresist layer 41, and then, a patterning is carried out to form a mask for opening the scribe lane region II. By using this mask, the residual titanium nitride of the scribe lane region II is removed after carrying out a chemical-mechanical polishing on the titanium nitride layer 40.

The removal of the residual titanium nitride is carried out by employing a wet etch or a dry etch.

Thus if the residual titanium nitride of the scribe lane region II is removed, the problems (such as titanium nitride bubbles) that may occur at the forth-coming process steps can be essentially eliminated.

Then a lower electrode 43, a ferroelectric thin film 44 and an upper electrode 45 are sequentially deposited on the entire surface. Under this condition, the lower electrode 43 and the upper electrode 45 are deposited in a form of a thin film by employing a process selected from among the physical vapor deposition method (PVD), the chemical vapor deposition method (CVD) and the atomic layer deposition method (ALD), while the ferroelectric thin film 44 is formed by applying the spin-on method.

Under this condition, the aligning key and overlay vernier regions that are formed in the scribe lane region II have a shallow depth, and therefore, the ferroelectric thin film 44 is deposited to a thin thickness.

Figure 2D:
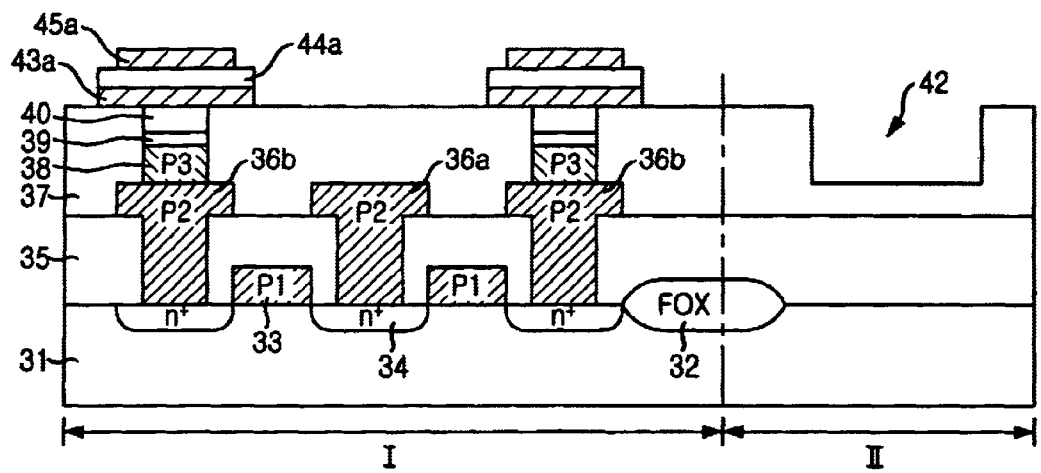

Then as shown in FIG. 2d, the upper electrode 45 is first etched, and then, the ferroelectric thin film 44 and the lower electrode 43 are sequentially etched, thereby forming a capacitor consisting of a lower electrode 43a/a ferroelectric thin film 44a/an upper electrode 45a.

Under this condition, a two-stage process can be carried out in which first the upper electrode 45a is etched, and then, the ferroelectric thin film 44a and the lower electrode 43a are simultaneously etched. Or a single stage process may be adopted in which the upper electrode 45a, the ferroelectric thin film 44a and the lower electrode 43a are simultaneously etched.

The ferroelectric thin film 44a is formed by using any one selected from the group consisting of: SBT, PZT, BLT and SBTN.

When the aligning key and overlay vernier regions are simultaneously formed during the formation of the polysilicon plug as described above, the depths of the aligning key and overlay vernier regions become shallow as much as the height of the landing pad. Accordingly, the thickness of the ferroelectric thin film becomes shallower, and the cracking of the ferroelectric thin film can be prevented at a later thermal process.

The claimed inventions were described with the aid of a specific preferred exemplary embodiment and the attached drawings, but it should be apparent to those ordinarily skilled in the art that various changes and modifications can be added without departing from the spirit and scope of the present invention that will be defined in the appended claims.

According to the inventions as described above, the landing pad is formed before the formation of the polysilicon plug. Therefore, when carrying out the etching for forming the plug contact hole together with the aligning key and overlay vernier regions, the depth of the regions can be made shallow. As a result, the cracking of the ferroelectric thin film can be prevented at the forth-coming process steps.

What is claimed is:

1. A method for fabricating a ferroelectric memory device, comprising the steps of:

forming a transistor on a cell region of a semiconductor substrate, the semiconductor substrate including the cell region and a scribe lane region, and the transistor including a source/drain;

forming a first interlayer dielectric film upon the transistor;

selectively etching the first interlayer dielectric film to form a first contact hole and to expose the source/drain;

forming a first conductive film on an entire surface (including the first contact hole);

selectively etching the first conductive film to form a first conductive pad, the first conductive pad being connected through the first contact hole to the source/drain;

forming a second interlayer dielectric film on an entire surface (including the first conductive film);

selectively etching the second interlayer dielectric film to form a second contact hole so as to expose the first conductive pad and to form an aligning key region only in the second interlayer dielectric film in the scribe lane region;

forming a second conductive film on an entire surface (including the second contact hole);

selectively etching the second conductive film to form a plug, the plug being connected through the second contact hole to the first conductive pad; and sequentially forming a lower electrode, a ferroelectric thin film and an upper electrode on the second interlayer dielectric film (including the plug).

2. The method as claimed in claim 1, wherein the aligning key region is etched to a depth same as that of the second contact hole.

3. The method as claimed in claim 1, wherein the second contact hole and the aligning key region are formed down to a depth of 1000 Å~5000 Å.

4. The method as claimed in claim 1, wherein the first conductive film is formed by using any one selected from the group consisting of: phosphorus-doped polysilicon, arsenic-doped polysilicon, tungsten and tungsten silicide.

5. The method as claimed in claim 1, wherein the second conductive film is formed by using any one selected from the group consisting of: phosphorus-doped polysilicon, arsenic-doped polysilicon, tungsten, tungsten suicide, TiN, TiAlN, TaSiN, TiSiN, TaN, TaAlN, TiSi and TaSi.

6. The method as claimed in claim 1, wherein the step of forming the plug comprises the sub-steps of:

burying the plug into the second contact hole;

forming a third conductive film on the second interlayer dielectric film, the second interlayer dielectric film including the plug;

carrying out a chemical-mechanical polishing on the third conductive film until the second interlayer dielectric film is exposed; and removing a residual third conductive film remaining on the scribe lane region.

7. The method as claimed in claim 6, wherein the third conductive layer is formed by using titanium nitride.

8. The method as claimed in claim 6, wherein the step of removing the third conductive film comprises the sub-steps of:

spreading photoresist on the second interlayer dielectric film to form a photoresist layer after carrying out the chemical-mechanical polishing on the third conductive film, and carrying out a patterning by exposure and development so as to form a mask for exposing the scribe lane region; and carrying out a dry or wet etching on the residual third conductive film of the scribe lane region by using the mask.

9. The method as claimed in claim 1, wherein a spin-on method is applied at the step of forming the ferroelectric thin film.

10. A method for fabricating a ferroelectric memory device, comprising the steps of:

forming a transistor on a cell region of a semiconductor substrate, the semiconductor substrate including the cell region and a scribe lane region, and the transistor including a source/drain;

forming a first interlayer dielectric film on an entire surface (including the transistor);

selectively etching the first interlayer dielectric film to form a first contact hole and to expose a dopant junction layer;

simultaneously forming a bit line and a landing pad so as to be connected through the first contact hole to the dopant junction layer;

forming a second interlayer dielectric film on an entire surface (including the bit line and the landing pad);

selectively etching the second interlayer dielectric film to form a second contact hole so as to expose the landing pad and to form an aligning key region only in the second interlayer dielectric film in the scribe lane region;

burying a stacked film of a plug and a barrier film into the second contact hole; and sequentially forming a lower electrode, a ferroelectric thin film and an upper electrode on an entire surface (including the barrier film).

11. The method as claimed in claim 10, wherein the aligning key region is etched to a depth same as that of the second contact hole.

12. The method as claimed in claim 10, wherein the second contact hole and the aligning key region are formed down to a depth of 100 Å~5000 Å.

13. The method as claimed in claim 10, wherein the step of forming the stacked structure of the plug and the barrier film comprises the sub-steps of:

depositing a first conductive film on the second interlayer dielectric film, the second interlayer dielectric film including the second contact hole;

selectively etching the first conductive film to form a plug for being buried into the second contact hole down to a certain depth;

forming a second conductive film on an entire surface, the entire surface including the plug;

carrying out a chemical-mechanical polishing on the second conductive film until the second interlayer dielectric film is exposed; and removing the residual second conductive film remaining on the scribe lane region.

14. The method as claimed in claim 13, wherein the first conductive film is formed by using any one selected from the group consisting of:

phosphorus-doped polysilicon, arsenic-doped polysilicon, tungsten, tungsten silicide, TIN, TiAlN, TaSiN, TiSiN, TaN, TaAlN, TiSi and TaSi.

15. The method as claimed in any one claims 13 and 14, wherein at the step of forming the plug, if the polysilicon is used for forming the first conductive film, an etch-back is carried out to form a recess of 500 Å~5000 Å.

16. The method as claimed in any one claims 13 and 14, wherein at the step of forming the plug, if a material other than the polysilicon is used for forming the first conductive film, a chemical-mechanical polishing or an etch-back is carried out.

17. The method as claimed in claim 13, wherein the step of removing the second conductive film comprises the sub-steps of:

spreading photoresist on the second interlayer dielectric film to form a photoresist layer after carrying out the chemical-mechanical polishing on the second conductive film, and carrying out a patterning by exposure and development so as to form a mask for exposing the second region; and carrying out a dry or wet etching on the residual second conductive film of the second region by using the mask.

18. The method as claimed in claim 10, wherein a spin-on method is applied at the step of forming the ferroelectric thin film.

19. The method as claimed in claim 10, wherein the bit line and the landing pad are formed by using any one selected from the group consisting of:

phosphorus-doped polysilicon, arsenic-doped polysilicon, tungsten, and tungsten silicide.

* * * * *